United States Patent
Lam

(10) Patent No.: US 12,328,066 B2
(45) Date of Patent: *Jun. 10, 2025

(54) LOW NOISE CHARGE PUMPS

(71) Applicant: Skyworks Solutions, Inc., Irvine, CA (US)

(72) Inventor: Lui Ray Lam, Lexington, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 97 days.

This patent is subject to a terminal disclaimer.

(21) Appl. No.: 18/300,740

(22) Filed: Apr. 14, 2023

(65) Prior Publication Data

US 2023/0283178 A1    Sep. 7, 2023

Related U.S. Application Data

(63) Continuation of application No. 17/664,851, filed on May 24, 2022, now Pat. No. 11,658,568, which is a
(Continued)

(51) Int. Cl.
*H02M 3/07*    (2006.01)
*H01L 23/498*    (2006.01)
(Continued)

(52) U.S. Cl.
CPC .......... *H02M 3/07* (2013.01); *H01L 23/49811* (2013.01); *H01L 23/49822* (2013.01); *H02M 3/071* (2021.05); *H03F 3/20* (2013.01); *H03F 2200/451* (2013.01); *H04B 1/38* (2013.01); *H04W 84/042* (2013.01)

(58) Field of Classification Search
CPC ........ H02M 3/07; H02M 3/071; H02M 3/072; H02M 1/0003; H02M 1/14
See application file for complete search history.

(56) References Cited

U.S. PATENT DOCUMENTS 5,469,110 A    11/1995  Liao
6,486,728 B2    11/2002  Kleveland
(Continued)

FOREIGN PATENT DOCUMENTS

CN    203537232    4/2014
JP    2005-515657    5/2005
(Continued)

*Primary Examiner* — Sibin Chen
(74) *Attorney, Agent, or Firm* — Knobbe, Martens, Olson & Bear, LLP

(57) ABSTRACT

Low noise charge pumps are disclosed. In certain embodiments, a charge pump includes a charge pump output terminal configured to provide a charge pump voltage, a switched capacitor, an inverter having an output electrically connected to a first end of the switched capacitor, a pair of charging switches connected between a second end of the switched capacitor and a reference voltage, and a pair of discharging switches connected between the second end of the switched capacitor and the charge pump output terminal. The pair of charging switches is closed during a charging operation and open during a discharging operation, while the pair of discharging switches closed during the discharging operation and open during the charging operation.

20 Claims, 16 Drawing Sheets

Related U.S. Application Data continuation of application No. 17/247,886, filed on Dec. 29, 2020, now Pat. No. 11,374,491.

(60) Provisional application No. 62/958,890, filed on Jan. 9, 2020.

(51) Int. Cl.
*H03F 3/20* (2006.01)
*H04B 1/38* (2015.01)
*H04W 84/04* (2009.01)

(56) References Cited

U.S. PATENT DOCUMENTS

| | | | |
|---|---|---|---|
| 6,680,653 | B2 | 1/2004 | Griffith et al. |
| 8,503,203 | B1* | 8/2013 | Szczeszynski ........ H02M 3/073 327/356 |
| 9,306,526 | B2 | 4/2016 | Lam et al. |
| 9,362,870 | B2 | 6/2016 | Lam |
| 9,425,852 | B2 | 8/2016 | Lam et al. |
| 9,467,124 | B2 | 10/2016 | Crandall |
| 9,503,026 | B2 | 11/2016 | Lam et al. |
| 9,608,576 | B2 | 3/2017 | Lam |
| 9,628,029 | B2 | 4/2017 | Huang et al. |
| 9,678,528 | B2 | 6/2017 | Ripley |
| 9,705,554 | B2 | 7/2017 | Li et al. |
| 9,787,258 | B2 | 10/2017 | Lam et al. |
| 9,813,027 | B2 | 11/2017 | Quaglietta et al. |
| 9,825,591 | B2 | 11/2017 | Lam et al. |
| 9,837,993 | B2 | 12/2017 | Crandall |
| 9,998,002 | B2 | 6/2018 | Englekirk |
| 10,003,308 | B2 | 6/2018 | Lam |
| 10,044,397 | B2 | 8/2018 | Li et al. |
| 10,050,522 | B2 | 8/2018 | Scheel |
| 10,111,115 | B2 | 10/2018 | Lam et al. |
| 10,122,322 | B2 | 11/2018 | Lam et al. |
| 10,149,347 | B2 | 12/2018 | Huang et al. |
| 10,158,333 | B2 | 12/2018 | Huang et al. |
| 10,236,829 | B2 | 3/2019 | Lam et al. |
| 10,666,134 | B2 | 5/2020 | Low et al. |
| 11,374,491 | B2 | 6/2022 | Lam |
| 11,658,568 | B2 | 5/2023 | Lam |
| 2005/0122751 | A1 | 6/2005 | Zeng et al. |
| 2006/0194567 | A1 | 8/2006 | Kelly et al. |
| 2007/0103224 | A1 | 5/2007 | Namekawa et al. |
| 2007/0177412 | A1* | 8/2007 | Sharp ...................... H02M 3/07 363/59 |
| 2007/0273431 | A1 | 11/2007 | Sakurai et al. |
| 2008/0284498 | A1 | 11/2008 | Xu et al. |
| 2010/0156518 | A1 | 6/2010 | Hoque et al. |
| 2011/0074481 | A1 | 3/2011 | Lin |
| 2014/0103897 | A1 | 4/2014 | Wang et al. |
| 2016/0126832 | A1 | 5/2016 | Zhou et al. |
| 2017/0124008 | A1 | 5/2017 | Chen et al. |
| 2017/0124013 | A1 | 5/2017 | Vaillancourt et al. |
| 2017/0149328 | A1 | 5/2017 | Wang et al. |
| 2017/0179819 | A1* | 6/2017 | Notoya .................... H02M 3/07 |
| 2017/0271873 | A1* | 9/2017 | Huang ..................... H02J 7/34 |
| 2017/0277216 | A1 | 9/2017 | Ripley |
| 2017/0279354 | A1 | 9/2017 | Leuders et al. |
| 2018/0034424 | A1 | 2/2018 | Lam et al. |
| 2018/0054169 | A1 | 2/2018 | Lam et al. |
| 2018/0062585 | A1 | 3/2018 | Quaglietta et al. |
| 2018/0091045 | A1 | 3/2018 | Englekirk |
| 2018/0123451 | A1 | 5/2018 | Larsen et al. |
| 2018/0331661 | A1 | 11/2018 | Lam |
| 2019/0036494 | A1 | 1/2019 | Ng et al. |
| 2019/0079549 | A1 | 3/2019 | Lam et al. |
| 2019/0140537 | A1 | 5/2019 | Scheel |
| 2019/0140595 | A1 | 5/2019 | Lam et al. |
| 2019/0182894 | A1 | 6/2019 | Huang et al. |
| 2019/0319585 | A1 | 10/2019 | Lam et al. |
| 2019/0386619 | A1 | 12/2019 | Huang et al. |
| 2020/0041357 | A1 | 2/2020 | Lam |
| 2020/0106395 | A1 | 4/2020 | Quaglietta et al. |
| 2020/0159275 | A1 | 5/2020 | Ripley |
| 2020/0161965 | A1 | 5/2020 | Zhou et al. |
| 2020/0162034 | A1 | 5/2020 | Lam et al. |
| 2020/0228006 | A1 | 7/2020 | Scheel |
| 2020/0387465 | A1 | 12/2020 | Chen et al. |

FOREIGN PATENT DOCUMENTS

| | | |
|---|---|---|
| JP | 2010-017013 | 1/2010 |
| JP | 2010-130135 | 6/2010 |
| JP | 2011-223829 | 11/2011 |
| JP | 2016-514446 | 5/2016 |
| JP | 2017-034957 | 2/2017 |
| WO | WO 2014-062832 | 4/2014 |
| WO | WO 2012/063494 | 5/2014 |

* cited by examiner

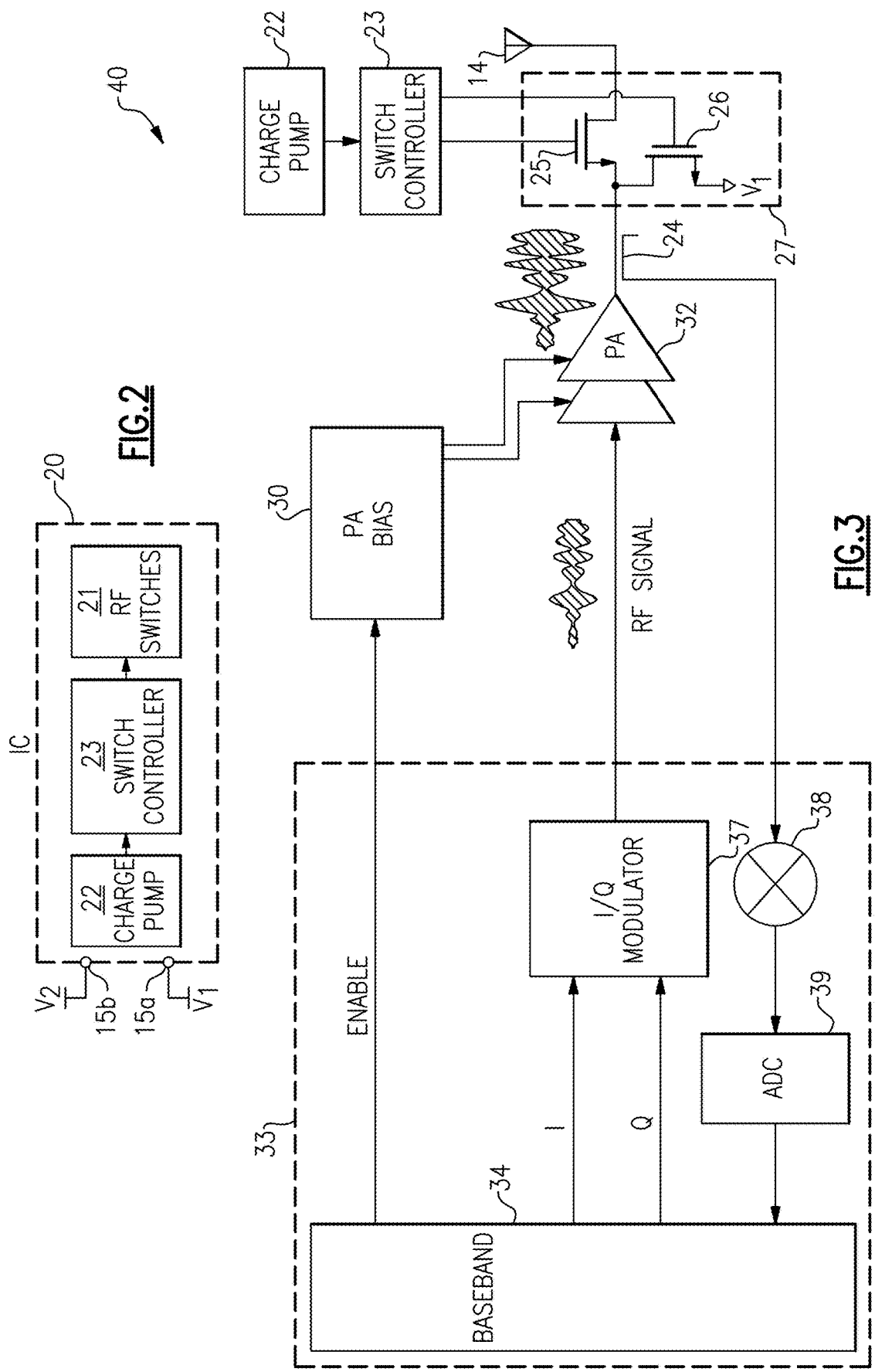

LOW NOISE CHARGE PUMPS

CROSS-REFERENCE TO RELATED APPLICATIONS

This application is a continuation of U.S. patent application Ser. No. 17/664,851, filed May 24, 2022 and titled "LOW NOISE CHARGE PUMPS," which is a continuation of U.S. patent application Ser. No. 17/247,886, filed Dec. 29, 2020 and titled "LOW NOISE CHARGE PUMPS," which claims the benefit of priority under 35 U.S.C. § 119 of U.S. Provisional Patent Application No. 62/958,890, filed Jan. 9, 2020 and titled "LOW NOISE CHARGE PUMPS," each of which is herein incorporated by reference in its entirety.

BACKGROUND

Field

Embodiments of the invention relate to electronic systems, and in particular, to charge pumps for radio frequency electronics.

Description of Related Technology

Radio frequency (RF) communication systems can utilize DC-to-DC power conversion to enhance operating performance. Often, voltages that exceed a battery voltage are needed or desired, while in other situations, voltages that are significantly less than the battery voltage are utilized. A charge pump it a type of DC-to-DC power converter that receives an input voltage and generates a higher or lower voltage based on the input voltage. For example, a charge pump can use capacitors as energy storage elements to convert the input voltage into a higher voltage or a lower voltage.

Examples of RF communication systems with one or more charge pumps include, but are not limited to, mobile phones, tablets, base stations, network access points, laptops, and wearable electronics. Power amplifiers provide amplification to RF signals, which can have a frequency in the range from about 30 kHz to 300 GHz, for instance, in the range of about 410 MHz to about 7.125 GHz for Fifth Generation (5G) cellular communications in Frequency Range 1 (FR1).

SUMMARY

In certain embodiments, the present disclosure relates to a front end system. The front end system includes a radio frequency switch, a switch controller configured to bias the radio frequency switch with a charge pump voltage in a first state of a switch enable signal, and a charge pump configured to generate the charge pump voltage at a charge pump output terminal. The charge pump includes a switched capacitor and a plurality of switches configured to charge the switched capacitor during a charging operation of the charge pump and to connect the switched capacitor to the charge pump output terminal during a discharging operation of the charge pump. The plurality of switches are configured to operate with non-overlap between the charging operation and the discharging operation.

In various embodiments, the charge pump is powered by a power high supply voltage and a ground voltage, the charge pump voltage less than the ground voltage.

In several embodiments, the charge pump includes an inverter having an output electrically connected to a first end of the switched capacitor. According to some embodiments, the plurality of switches includes a pair of charging switches connected between a second end of the switched capacitor and a reference voltage, and a pair of discharging switches connected between the second end of the switched capacitor and the charge pump output terminal. In accordance with a number of embodiments, the pair of charging switches is closed during the charging operation and open during the discharging operation, and the pair of discharging switches is closed during the discharging operation and open during the charging operation. According to various embodiments, during a transition from the charging operation to the discharging operation, one charging switch of the pair of charging switches is open and the other charging switch of the pair of charging switches is closed. In accordance with some embodiments, during the transition from the charging operation to the discharging operation, one discharging switch of the pair of discharging switches is open and the other discharging switch of the pair of discharging switches is closed. According to a number embodiments, a first charging switch of the pair of charging switches is controlled by a first clock phase signal, an input of the inverter receives a second clock phase signal delayed relative to the first clock phase signal, and a second charging switch of the pair of charging switches is controlled by a third clock signal phase delayed relative to the second clock phase signal. In accordance with various embodiments, a first discharging switch of the pair of discharging switches is controlled by an inverted version of the first clock phase signal and a second discharging switch of the pair of discharging switches is controlled by an inverted version of the third clock phase signal. According to some embodiments, the inverter is powered by a power high supply voltage and a ground voltage.

In several embodiments, the charge pump further includes an oscillator configured to generate a first plurality of clock signal phases, and combinatorial logic configured to process the first plurality of clock signal phases to generate a second plurality of clock signal phases, at least a portion of the switches controlled by the second plurality of clock signal phases.

In various embodiments, the charge pump includes a plurality of stages including a first stage and a second stage, the first stage including the plurality of switches and the switched capacitor. According to a number of embodiments, the plurality of switches are controlled in part by a clock signal from the second stage.

In certain embodiments, the present disclosure relates to a method of generating a charge pump voltage. The method includes charging a switched capacitor using a plurality of switches during a charging operation of a charge pump, transitioning the charge pump from the charging operation to a discharging operation with non-overlap, and connecting the switched capacitor to a charge pump output terminal during the discharging operation.

In various embodiments, the method further includes powering the charge pump using a power high supply voltage and a ground voltage, and providing a providing a charge pump output voltage less than the ground voltage at the charge pump output terminal.

In several embodiments, the method further includes controlling a first end of the switched capacitor using an output of an inverter. According to a number of embodiments, the method further includes controlling a second end of the switched capacitor using the plurality of switches. In accordance with some embodiments, the plurality of switches includes a pair of charging switches connected between a second end of the switched capacitor and a reference voltage, and a pair of discharging switches connected between the second end of the switched capacitor and the charge pump output terminal. According to several embodiments, the method further includes closing the pair of charging switches during the charging operation, opening the pair of discharging switches during the charging operation, opening the pair of charging switches during the discharging operation, and closing the pair of discharging switches during the discharging operation. In accordance with a number of embodiments, the method further includes opening one charging switch of the pair of charging switches and closing the other charging switch of the pair of charging switches during a transition from the charging operation to the discharging operation. According to some embodiments, the method further includes opening one discharging switch of the pair of discharging switches and closing the other discharging switch of the pair of discharging switches during a transition from the charging operation to the discharging operation. In accordance with several embodiments, the method further includes controlling a first charging switch of the pair of charging switches with a first clock phase signal, providing an input of the inverter with a second clock phase signal delayed relative to the first clock phase signal, and controlling a second charging switch of the pair of charging switches with a third clock signal phase delayed relative to the second clock phase signal. According to a number of embodiments, the method further includes controlling a first discharging switch of the pair of discharging switches with an inverted version of the first clock phase signal, and controlling a second discharging switch of the pair of discharging switches with an inverted version of the third clock phase signal.

In some embodiments, the method further includes generating a first plurality of clock signal phases using an oscillator, processing the first plurality of clock signal phases to generate a second plurality of clock signal phases using combinatorial logic, and controlling at least a portion of the switches using the second plurality of clock signal phases.

In several embodiments, the charge pump includes a plurality of stages including a first stage and a second stage, the first stage including the plurality of switches and the switched capacitor, the method further comprising controlling the plurality of switches in part by a clock signal from the second stage.

In certain embodiments, the present disclosure relates to a charge pump. The charge pump includes a charge pump output terminal configured to provide a charge pump voltage, a switched capacitor, and a plurality of switches configured to charge the switched capacitor during a charging operation of the charge pump and to connect the switched capacitor to the charge pump output terminal during a discharging operation of the charge pump. The plurality of switches is configured to operate with non-overlap between the charging operation and the discharging operation.

In various embodiments, the charge pump voltage is less than a ground voltage.

In some embodiments, the charge pump further includes an inverter having an output electrically connected to a first end of the switched capacitor. According to a number of embodiments, the plurality of switches includes a pair of charging switches connected between a second end of the switched capacitor and a reference voltage, and a pair of discharging switches connected between the second end of the switched capacitor and the charge pump output terminal. In accordance with various embodiments, the pair of charging switches is closed during the charging operation and open during the discharging operation, and the pair of discharging switches is closed during the discharging operation and open during the charging operation. According to several embodiments, during a transition from the charging operation to the discharging operation, one charging switch of the pair of charging switches is open and the other charging switch of the pair of charging switches is closed. In accordance with a number of embodiments, during the transition from the charging operation to the discharging operation, one discharging switch of the pair of discharging switches is open and the other discharging switch of the pair of discharging switches is closed. In accordance with various embodiments, a first charging switch of the pair of charging switches is controlled by a first clock phase signal, an input of the inverter receives a second clock phase signal delayed relative to the first clock phase signal, and a second charging switch of the pair of charging switches is controlled by a third clock signal phase delayed relative to the second clock phase signal. According to several embodiments, a first discharging switch of the pair of discharging switches is controlled by an inverted version of the first clock phase signal and a second discharging switch of the pair of discharging switches is controlled by an inverted version of the third clock phase signal. In accordance with a number of embodiments, the inverter is powered by a power high supply voltage and a ground voltage.

In several embodiments, the charge pump further includes an oscillator configured to generate a first plurality of clock signal phases, and combinatorial logic configured to process the first plurality of clock signal phases to generate a second plurality of clock signal phases, at least a portion of the switches controlled by the second plurality of clock signal phases.

In various embodiments, the charge pump includes a plurality of stages including a first stage and a second stage, the first stage including the plurality of switches and the switched capacitor. According to a number of embodiments, the plurality of switches are controlled in part by a clock signal from the second stage.

BRIEF DESCRIPTION OF THE DRAWINGS

FIG. 2 is a schematic diagram of one embodiment of an integrated circuit (IC).

FIG. 3 is a schematic diagram of one embodiment of a power amplifier system.

DETAILED DESCRIPTION OF EMBODIMENTS

Figure 1:
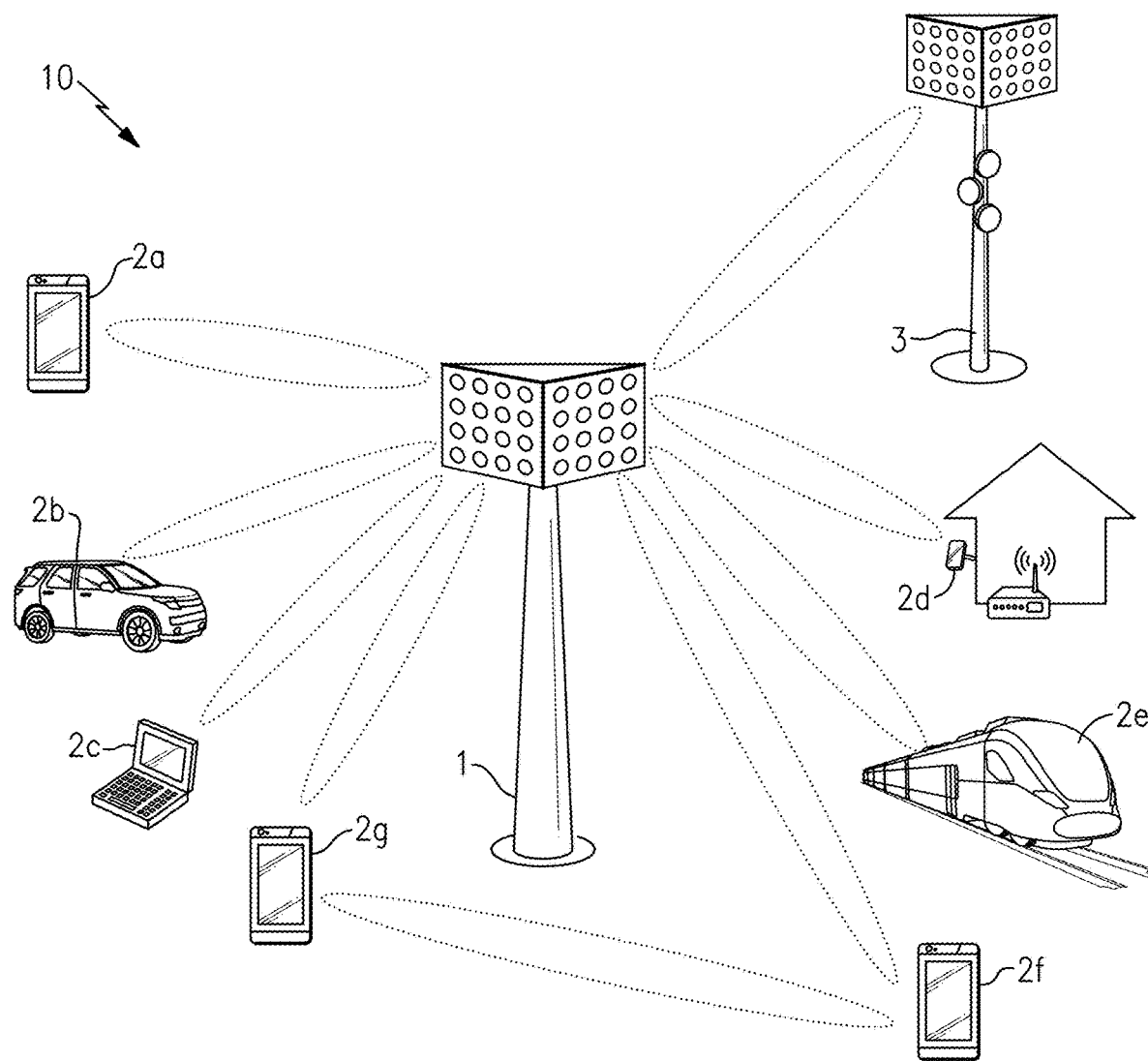
FIG. 1 is a schematic diagram of one example of a communication network.

The headings provided herein, if any, are for convenience only and do not necessarily affect the scope or meaning of the claimed invention.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and plans to introduce Phase 2 of 5G technology in Release 16 (targeted for 2019). Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 20.

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

FIG. 2 is a schematic diagram of one embodiment of an integrated circuit (IC) 20. The illustrated IC 20 includes a first pin 15a that receives a power low supply voltage $V_1$ (for instance, ground) and a second pin 15b that receives a power high supply voltage $V_2$. Additionally, the illustrated IC 20 further includes RF switches 21, a charge pump 22, and a switch controller 23. Although not illustrated in FIG. 2 for clarity of the figures, the IC 20 typically includes additional pins and circuitry.

The charge pump 22 can be used to generate a charge pump voltage that has a voltage level less than that of the power low supply voltage $V_1$. The switch controller 23 receives the charge pump voltage, which can be used in part to control the RF switches 21.

For example, the illustrated IC 20 can represent a front-end module (FEM), and the RF switches 21 can include n-type metal oxide semiconductor (NMOS) switch transistors including gates that are biased to a voltage level of the charge pump voltage when in the off state. Controlling the gate voltage of an NMOS switch transistor to a voltage below a power low supply voltage in the off state can increase off state impedance, which can enhance isolation in multi-band applications.

When the NMOS switch transistors operate in the on state, the NMOS switch transistors can be biased to any suitable voltage level, such as the voltage level of the power high supply voltage $V_2$. In certain configurations, the power high supply voltage $V_2$ can correspond to a regulated voltage generated by an on-chip or off-chip regulator. Generating the power high supply voltage $V_2$ using a regulator can aid in controlling NMOS switch transistors operating in the on-state with a voltage level that is relatively constant with respect to temperature, battery voltage level, and/or current loading.

In certain configurations, the IC 20 is fabricated using a silicon on insulator (SOI) process, and the RF switches 21 can include SOI transistors. However, other configurations are possible.

FIG. 3 is a schematic diagram of one embodiment of a power amplifier system 40. The illustrated power amplifier system 40 includes an RF switching circuit 27 that includes a series switch transistor 25 and a shunt switch transistor 26. The illustrated power amplifier system 40 further includes a charge pump 22, a switch controller 23, a directional coupler 24, a power amplifier bias circuit 30, a power amplifier 32, and a transmitter 33. The illustrated transmitter 33 includes a baseband processor 34, an I/Q modulator 37, a mixer 38, and an analog-to-digital converter (ADC) 39.

The baseband processor 34 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, or any combination thereof. Moreover, in some implementations, two or more baseband processors 34 can be included in the power amplifier system 40.

The I/Q modulator 37 can be configured to receive the I and Q signals from the baseband processor 34 and to process the I and Q signals to generate an RF signal. For example, the I/Q modulator 37 can include DACs configured to convert the I and Q signals into an analog format, mixers for upconverting the I and Q signals to radio frequency, and a signal combiner for combining the upconverted I and Q signals into an RF signal suitable for amplification by the power amplifier 32. In certain implementations, the I/Q modulator 37 can include one or more filters configured to filter frequency content of signals processed therein.

The power amplifier bias circuit 30 can receive an enable signal ENABLE from the baseband processor 34, and can use the enable signal ENABLE to generate one or more bias signals for the power amplifier 32. The power amplifier 32 can receive the RF signal from the I/Q modulator 37.

The switch controller 23 can turn on and off the series switch transistor 25 and the shunt switch transistor 26 in a complementary manner. For example, the switch controller 23 can be used to turn on the series switch transistor 25 and turn off the shunt switch transistor 26 such that the power amplifier 32 provides an amplified RF signal to the antenna 14 through the series switch transistor 25. Additionally, the switch controller 23 can be used to turn off the series switch transistor 25 and turn on the shunt switch transistor 26 to provide a high impedance path between the output of the power amplifier 32 and the antenna 14 while providing termination to the power amplifier's output. To control a state of the RF switching circuit 27, the switch controller 23 can receive a switch enable signal.

The directional coupler 24 can be positioned between the output of the power amplifier 32 and the source of the series switch transistor 25, thereby allowing an output power measurement of the power amplifier 32 that does not include insertion loss of the series switch transistor 25. The sensed output signal from the directional coupler 24 can be provided to the mixer 38, which can multiply the sensed output signal by a reference signal of a controlled frequency so as to downshift the frequency content of the sensed output signal to generate a downshifted signal. The downshifted signal can be provided to the ADC 39, which can convert the downshifted signal to a digital format suitable for processing by the baseband processor 34.

By including a feedback path between the output of the power amplifier 32 and the baseband processor 34, the baseband processor 34 can be configured to dynamically adjust the I and Q signals to optimize the operation of the power amplifier system 40. For example, configuring the power amplifier system 40 in this manner can aid in controlling the power added efficiency (PAE) and/or linearity of the power amplifier 32.

In the illustrated configuration, the charge pump 22 provides a charge pump voltage to switch controller 23 used to control the series switch transistor 25 and the shunt switch transistor 26. In certain configurations, the charge pump voltage is used to bias the gate voltage of the series switch transistor 25 and/or the shunt switch transistor 26 when the series switch transistor 25 and/or the shunt switch transistor 26 is turned off. For example, the charge pump 22 can generate a negative charge pump voltage used to turn off the series switch transistor 25 and/or the shunt switch transistor 26.

Although the switch controller 23 is illustrated as generating switch control signals for two transistors, the switch controller 23 can be adapted to control more or fewer switch control transistors and/or other switch devices. For example, a switch controller can receive multiple switch enable signals and generate multiple switch control signals for controlling different RF switching circuits.

Figure 4A:
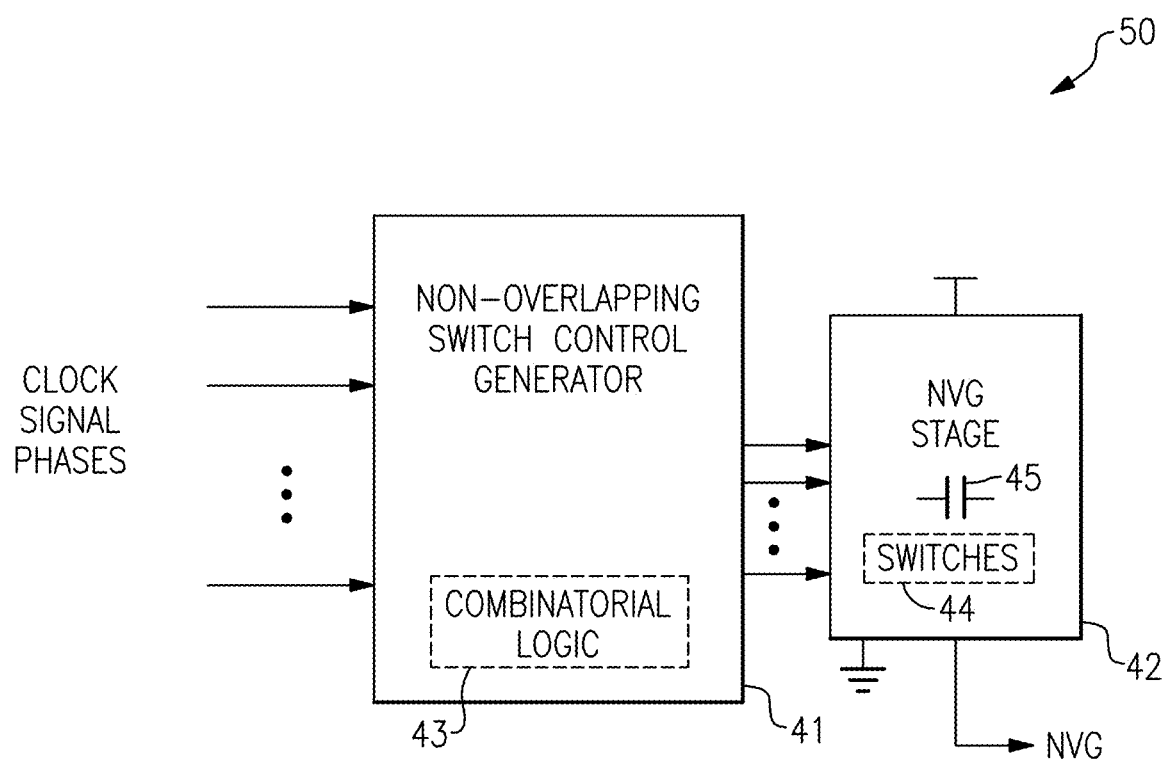
FIG. 4A is a schematic diagram of one embodiment of a charge pump.

FIG. 4A is a schematic diagram of one embodiment of a charge pump 50. The charge pump 50 includes a non-overlapping switch control generator 41 and a negative voltage generator (NVG) stage 42. Although shown as including one NVG stage 42, the charge pump 50 can be adapted to include additional stages. Furthermore, although shown in the context of negative voltage generation, the charge pump 50 can be adapted to operate as a positive voltage generator (PVG).

The NVG stage 42 includes switches 44 used to selectively charge and discharge a flying capacitor 45 to thereby generate a negative voltage NVG. The flying capacitor 45 is also referred to herein as a switched capacitor. The switches 44 can be implemented in a wide variety of ways, including, but not limited to, using field-effect transistors (for instance, metal oxide semiconductor (MOS) transistors, which can be n-type, p-type, or a combination thereof), bipolar transistors, diodes, microelectromechanical (MEMs) devices, and/or other types of switches.

As shown in FIG. 4A, the non-overlapping switch control generator 41 includes combinatorial logic 43 that processes clock signal phases (for instance, provided by an oscillator) to generate switch controls for opening or closing each of the switches 44 to thereby operate the NVG stage 42 in various phases associated with charging and discharging the flying capacitor 45.

The non-overlapping switch control generator 41 generates the switch control signals with non-overlap to prevent shoot through currents, such as preventing current between ground and the negative voltage NVG during transitions of the switches 44.

By preventing shoot through currents, noise spikes on ground and/or leakage on the negative voltage NVG is reduced.

Figure 4B:
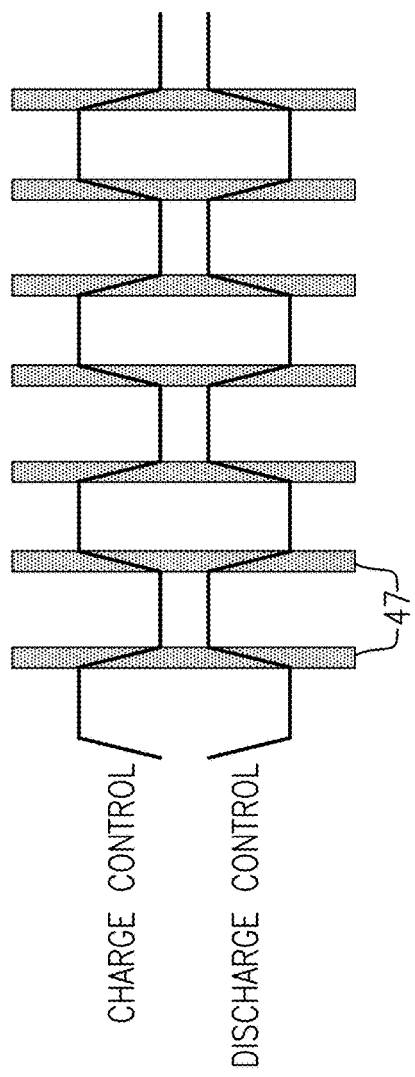
FIG. 4B is one example of a timing diagram for a charge pump with overlap.

FIG. 4B is one example of a timing diagram for a charge pump with overlap. The diagram depicts charge control signals for controlling charging of a flying capacitor and discharge control signals for controlling discharging of the flying capacitor. As shown in FIG. 4B, the charge pump operates with periods of overlap 47 when transitioning from charging to discharging and when transitioning from discharging to charging. The overlap 47 leads to shoot through currents that increase noise and/or otherwise degrade the performance of the charge pump.

Figure 4C:
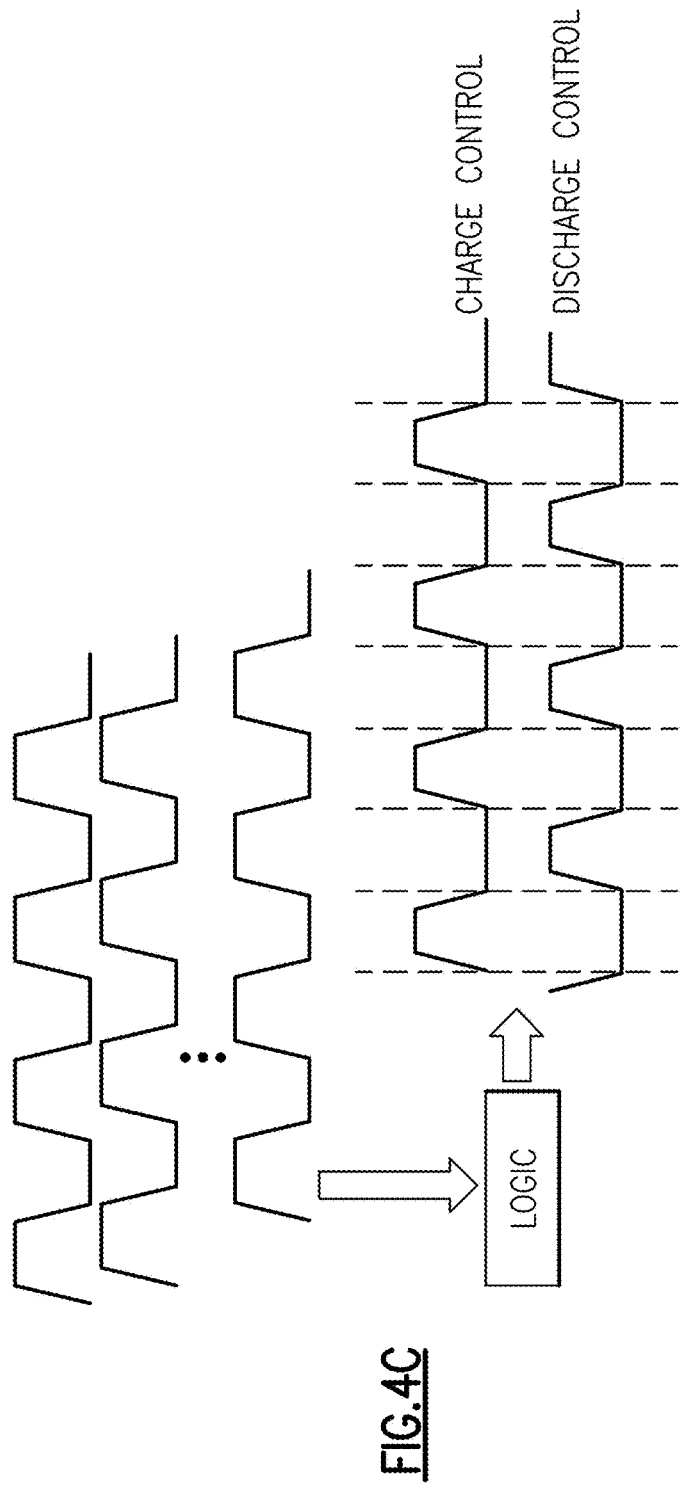
FIG. 4C is one example of a timing diagram for a charge pump with non-overlap.

FIG. 4C is one example of a timing diagram for a charge pump with non-overlap. As shown in FIG. 4C, combinatorial logic of the charge pump processes clock signal phases to generate charge control signals for controlling charging of a flying capacitor and discharge control signals for controlling discharging of the flying capacitor.

In contrast to the timing diagram of FIG. 4B, the timing diagram of FIG. 4C operates with non-overlap between transitions of the charge control waveform and transitions of the discharge control waveform. By providing non-overlap in this manner, shoot through current is prevent, which leads to a reduction in noise spikes and/or lower leakage on the negative voltage.

Figure 5A:
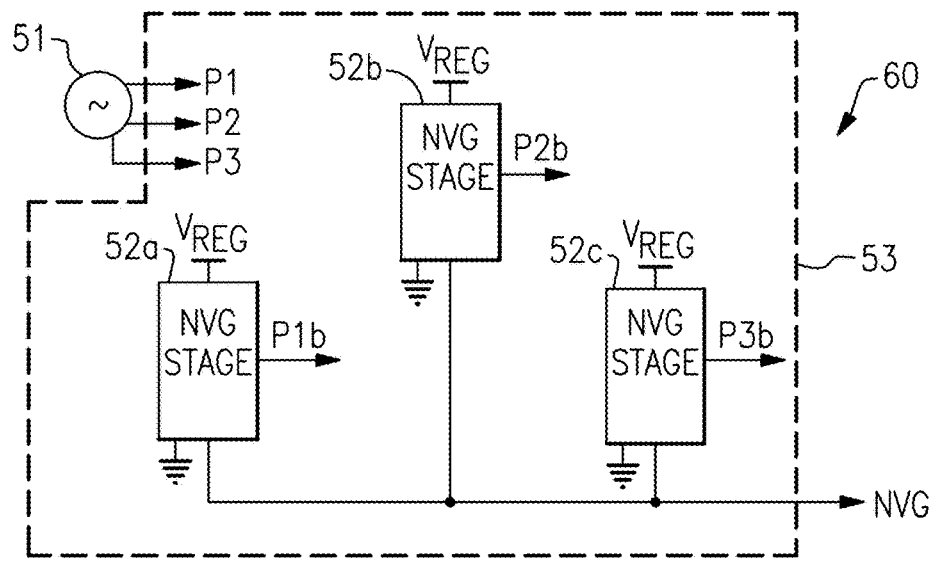
FIG. 5A is a schematic diagram of another embodiment of a charge pump.

FIG. 5A is a schematic diagram of another embodiment of a charge pump 60. The charge pump 60 includes an oscillator 51 and a group of charge pump stages 53. The group of charge pump stages 53 include a first NVG stage 52a, a second NVG stage 52b, and a third NVG stage 52c that operate in combination with one another to generate the negative voltage NVG. Although an implementation with three stages is shown, the charge pump 60 can be adapted to include more or fewer stages.

As shown in FIG. 5A, the oscillator 51 generates a first clock signal phase P1, a second clock signal phase P2, and a third clock signal phase P3 that are each of different phases. In particular, the second clock signal phase P2 is delayed relative to the first clock signal phase P1, and the third clock signal phase P3 is delayed relative to the second clock signal phase P2.

The first NVG stage 52a receives the first clock signal phase P1 and operates to invert the first clock signal phase P1 to generate a first inverted clock signal phase P1b. In certain implementations, the first NVG stage 52a generates the first inverted clock signal phase P1b not only with logical inversion but also with a voltage shift relative to the first clock signal phase P1. For example, implementing the first NVG stage 52a in this manner can aid in generating the first inverted clock signal phase P1b with voltage levels suitable for controlling switches.

With continuing reference to FIG. 5A, the second NVG stage 52b receives the second clock signal phase P2 and operates to invert the second clock signal phase P2 to generate a second inverted clock signal phase P2b. Additionally, the third NVG stage 52c receives the third clock signal phase P3 and operates to invert the third clock signal phase P3 to generate a third inverted clock signal phase P3b. In certain implementations, the second NVG stage 52b and the third NVG stage 52c provide voltage level shifting in addition to logical inversion.

The first NVG stage 52a, the second NVG stage 52b, and the third NVG stage 52c also receive various clock signal phases for controlling operation of charging and discharging operations of flying capacitors. The clock signal phases providing charging and discharging with non-overlap in accordance with the teachings herein.

In certain embodiments, the first NVG stage 52a receives the third clock signal phase P3 and the second clock signal phase P2 for controlling charging, and receives the second inverted clock signal P2b and the third inverted clock signal P3b for controlling discharging. Additionally, the second NVG stage 52b receives the first clock signal phase P1 and the third clock signal phase P3 for controlling charging, and receives the third inverted clock signal phase P3b and the first inverted clock signal phase P1b for controlling discharging. Furthermore, the third NVG stage 52c receives the second clock signal phase P2 and the first clock signal phase P1 for controlling charging, and receives the first inverted clock signal phase P1b and the second clock signal phase P2b for controlling discharging.

Figure 5B:
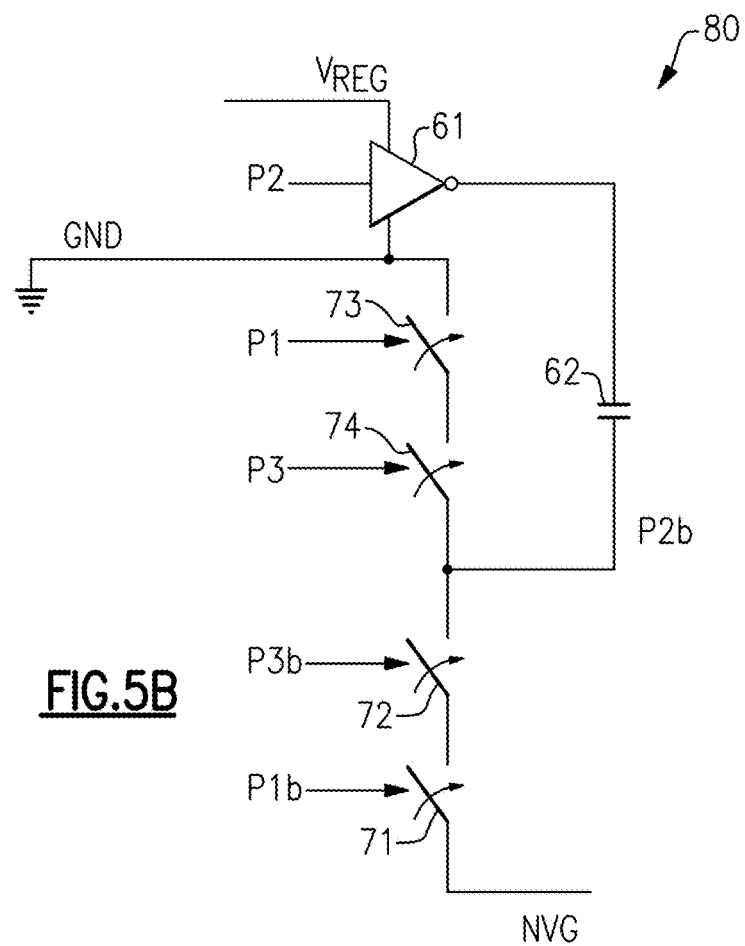
FIG. 5B is a schematic diagram of one embodiment of a charge pump stage.

FIG. 5B is a schematic diagram of one embodiment of a charge pump stage 80. The charge pump stage 80 includes an inverter 61, a flying capacitor 62, a first discharging switch 71, a second discharging switch 72, a first charging switch 73, and a second charging switch 74.

The charge pump stage 80 of FIG. 5B illustrates one embodiment of an NVG stage for the charge pump 60 of FIG. 5A (with clock signal phases corresponding to the second NVG stage 52b depicted). Although one embodiment of a charge pump stage is depicted, the teachings herein are applicable to charge pump stages implemented in a wide variety of ways.

As shown in FIG. 5B, the inverter 61 is powered by a regulated power supply voltage $V_{REG}$ and a ground voltage, which is also referred to herein as ground or GND. The inverter 61 further includes an input that receives a second clock signal phase P2 and an output connected to a first end of the flying capacitor 62. The flying capacitor 62 further includes a second end that generates a second inverted clock signal phase P2b that is both logically inverted and level shifted relative to the second clock signal phase P2.

With continuing reference to FIG. 5B, the first charging switch 73 and the second charging switch 74 are connected in series between ground and the second end of the flying capacitor 62. The first charging switch 73 is controlled by a first clock signal phase P1, while the second charging switch 74 is controlled by a third clock signal phase P3. Additionally, the first discharging switch 71 and the second discharging switch 72 are connected in series between the negative voltage NVG and the second end of the flying capacitor 62. The first discharging switch 71 is controlled by a first inverted clock signal phase P1b and the second discharging switch 72 is controlled by a third inverted clock signal phase P3b.

The charge pump stage 80 of FIG. 5B is implemented to provide non-overlap between charging and discharging operations of the flying capacitor 62. For example, the flying capacitor 62 is charged when both the first charging switch 73 and the second charging switch 74 are turned on, but not charged when either or both of the first charging switch 73 and the second charging switch 74 are turned off. Additionally, the flying capacitor 62 is discharged when both the first discharging switch 71 and the second discharging switch 72 are turned on, but not discharged when either or both of the first discharging switch 71 and the second discharging switch 72 are turned off. Additionally, the depicted switches are timed to prevent non-overlap during transitions between charging and discharging operations. Providing such non-overlap serves to prevent shoot through currents and lower noise.

FIGS. 6A to 6G are schematic diagrams illustrating phases of operation of the charge pump stage 80 of FIG. 5B.

Figure 6A:
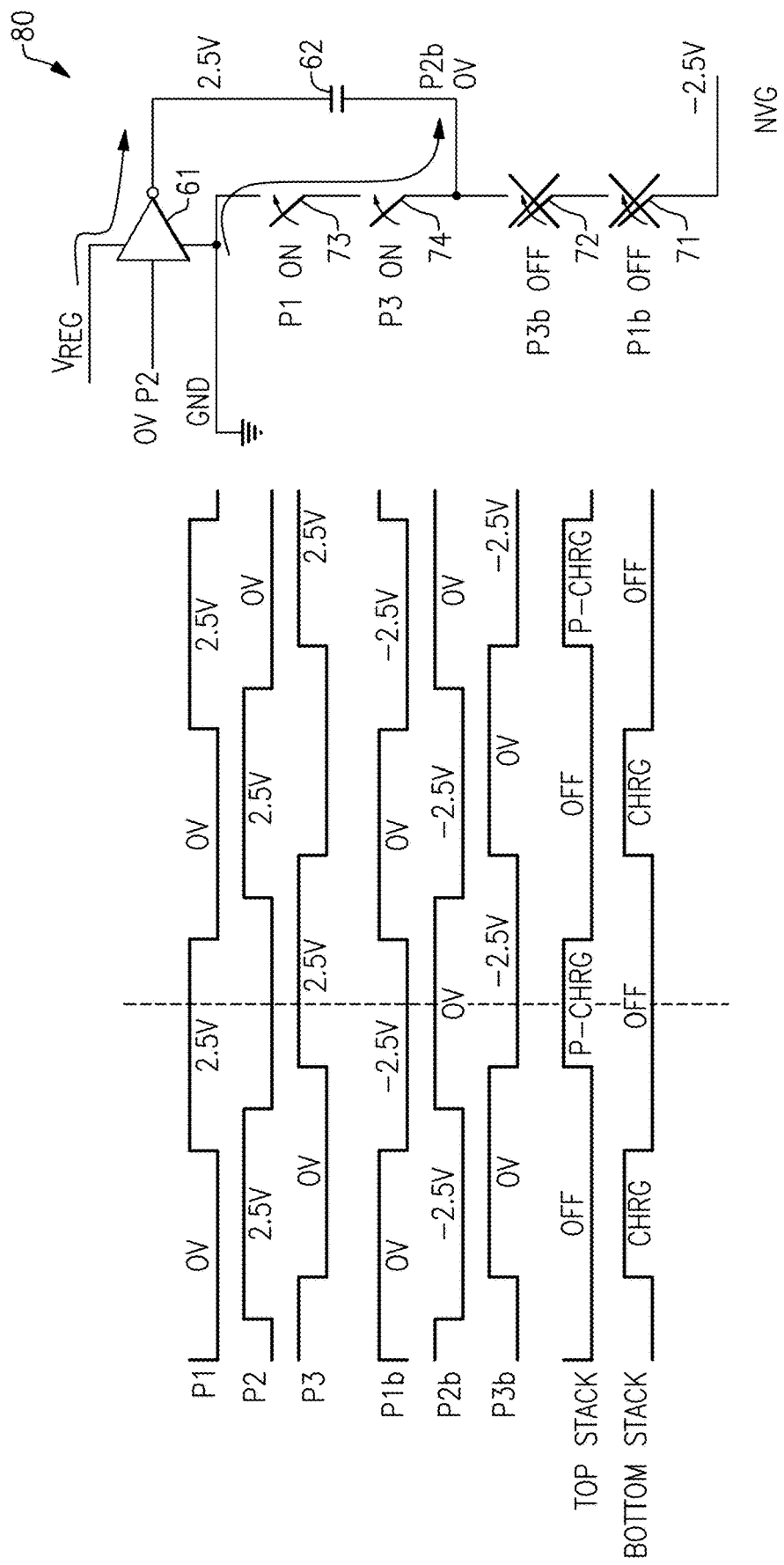
FIG. 6A is a first schematic diagram illustrating operation of the charge pump stage of FIG. 5B.

FIG. 6A depicts a first phase of operation of the charge pump stage 80 in which the first end of the flying capacitor 62 is controlled with the regulated voltage $V_{REG}$ and the second of the flying capacitor 62 is controlled with ground. As shown in FIG. 6A both the first charging switch 73 and the second charging switch 74 are turned on while both the first discharging switch 71 and the second discharging switch 72 are turned off.

Figure 6B:
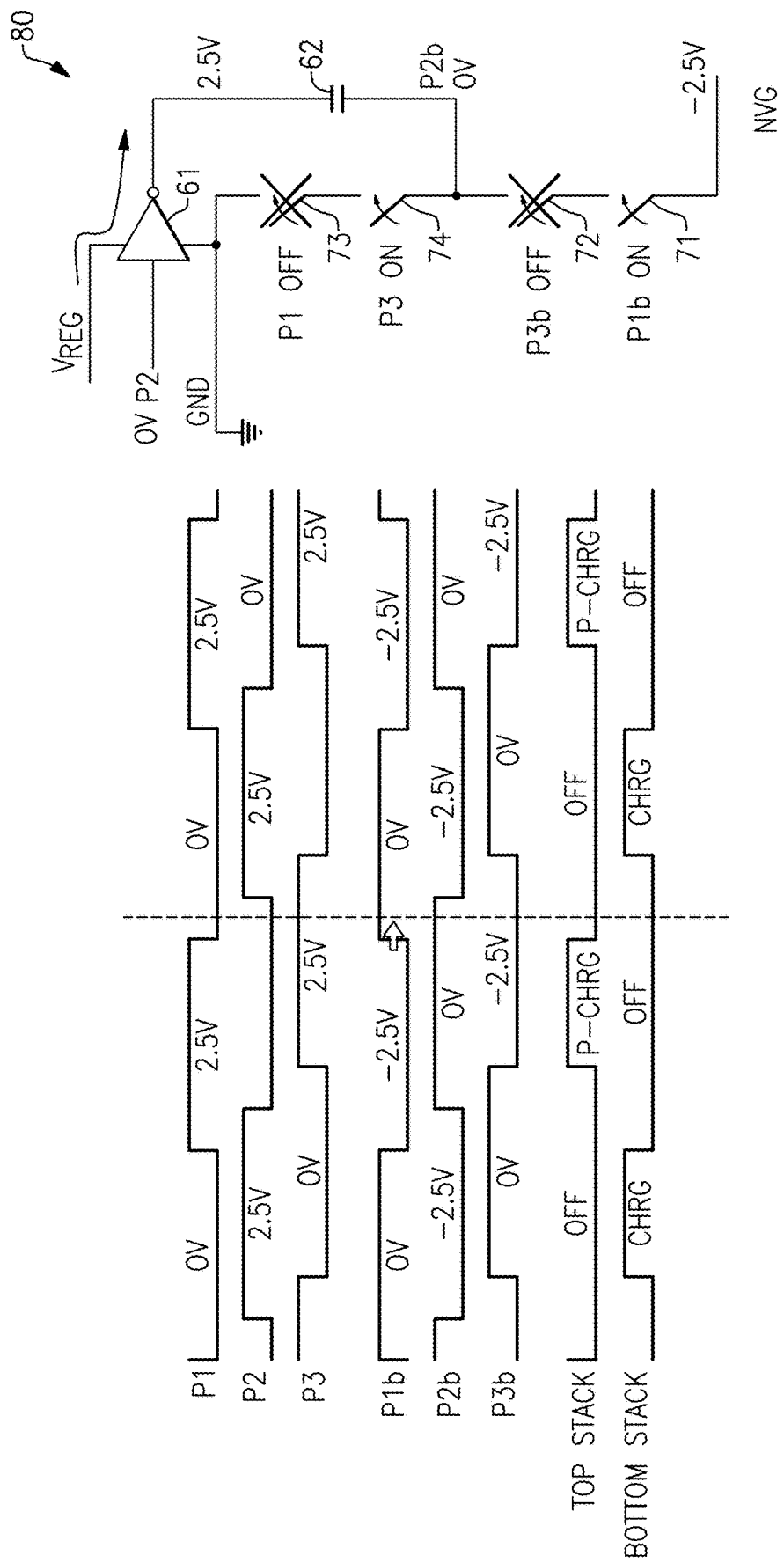
FIG. 6B is a second schematic diagram illustrating operation of the charge pump stage of FIG. 5B.

FIG. 6B depicts a second phase of operation of the charge pump stage 80 in which the first charging switch 73 is transitioned from the on state to the off state and in which the first discharging switch 71 is transitioned from the off state to the on state. As shown in FIG. 6B, the first end of the flying capacitor 62 remains connected to the regulated voltage $V_{REG}$, but the second end of the flying capacitor 62 is disconnected from ground since the first charging switch 73 is turned off. As shown in FIG. 6B, only one charging switch and only one discharging switch are turned on.

Figure 6C:
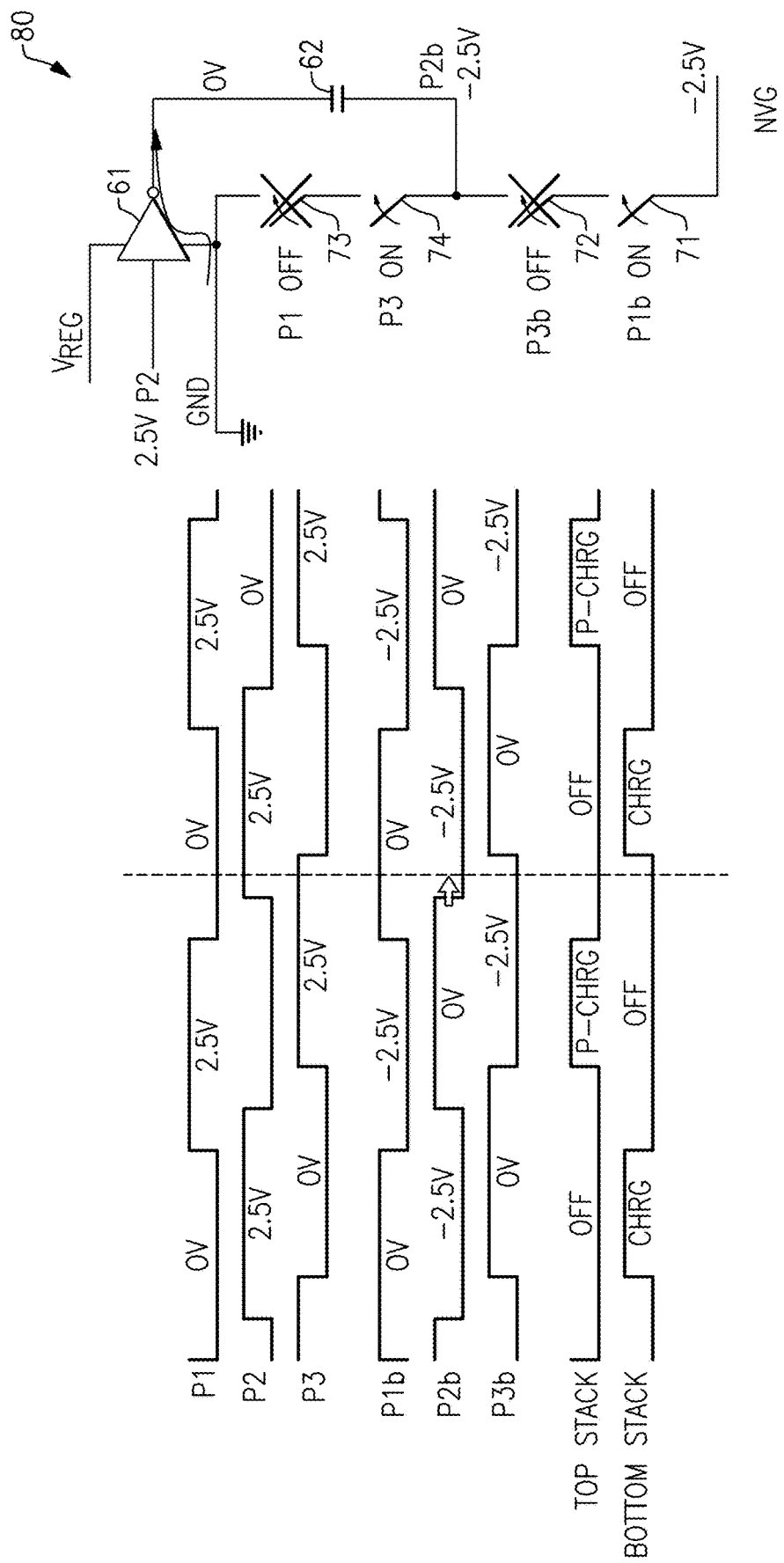
FIG. 6C is a third schematic diagram illustrating operation of the charge pump stage of FIG. 5B.

FIG. 6C depicts a third phase of operation of the charge pump stage 80 in which the second clock signal phase P2 transitions from low (0 V, in this example) to high (2.5 V, in this example). Since the second end of the flying capacitor 62 is electrically floating, the second end of the flying capacitor 62 transitions to a negative voltage (−2.5 V, in this example) in response to the output of the inverter 61 changing the voltage level at the first end of the flying capacitor 62 from high to low.

Figure 6D:
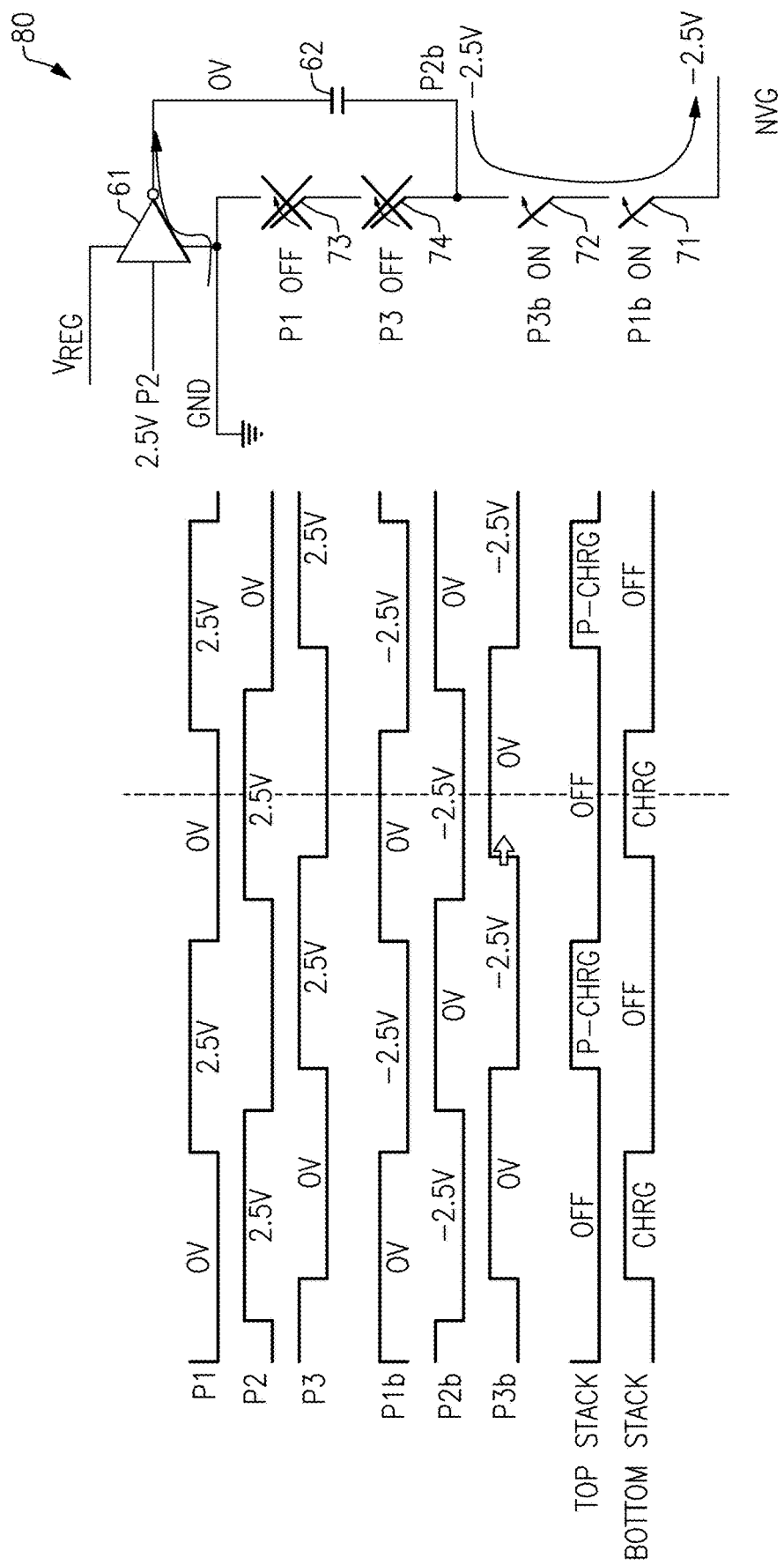
FIG. 6D is a fourth schematic diagram illustrating operation of the charge pump stage of FIG. 5B.

FIG. 6D depicts a fourth phase of operation of the charge pump stage 80 in which the second charging switch 74 is transitioned from the on state to the off state and in which the second discharging switch 72 is transitioned from the off state to the on state. As shown in FIG. 6D, in the fourth phase the second end of the flying capacitor 62 is connected to an output terminal that provides the negative voltage NVG. As shown in FIG. 6D, both discharging switches are turned on and both charging switches are turned off.

Figure 6E:
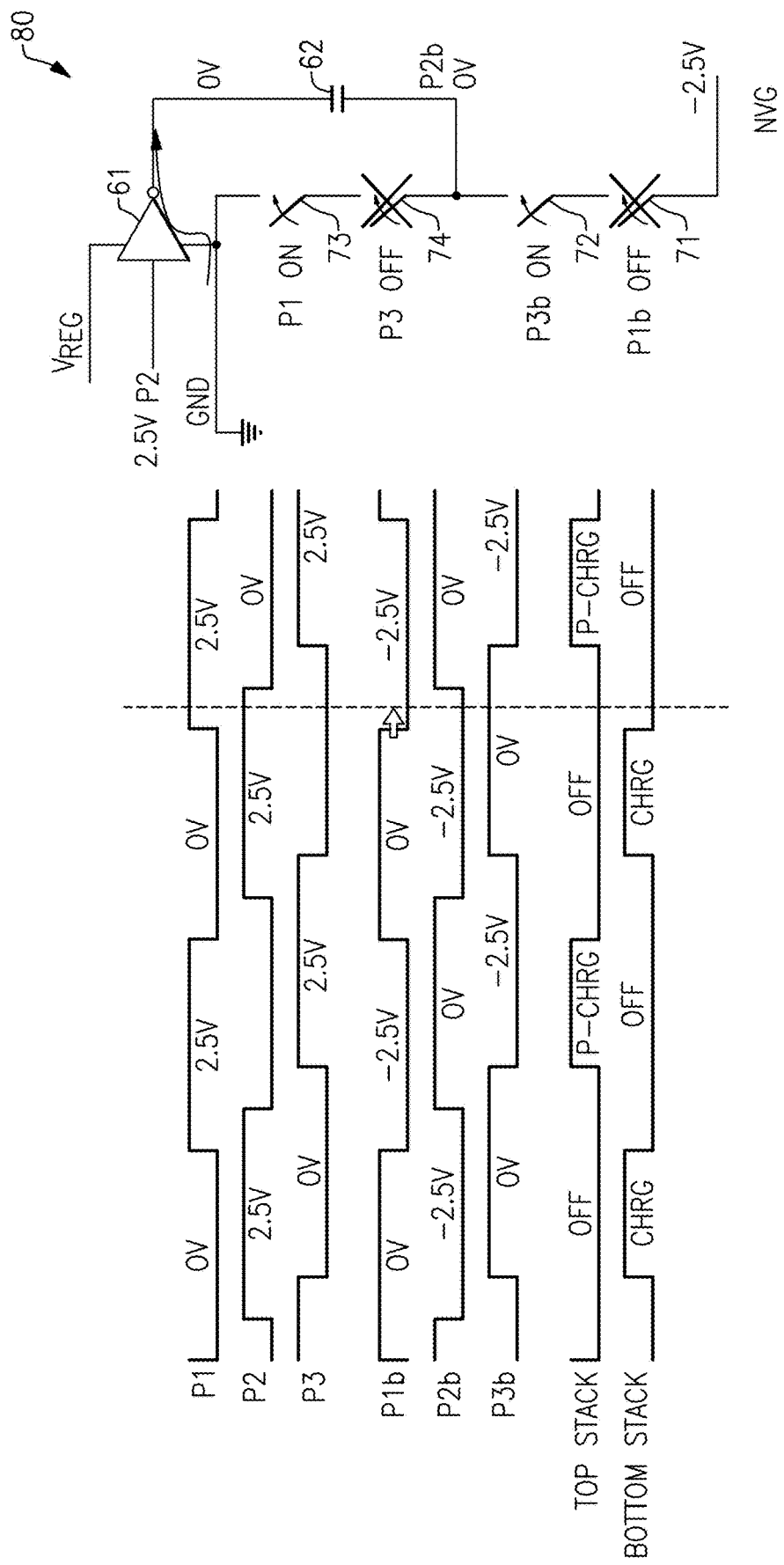
FIG. 6E is a fifth schematic diagram illustrating operation of the charge pump stage of FIG. 5B.

FIG. 6E depicts a fifth phase of operation of the charge pump stage 80 in which the first charging switch 73 is transitioned from the off state to the on state and in which the first discharging switch 71 is transitioned from the on state to the off state. As shown in FIG. 6E, only one charging switch and only one discharging switch are turned on.

Figure 6F:
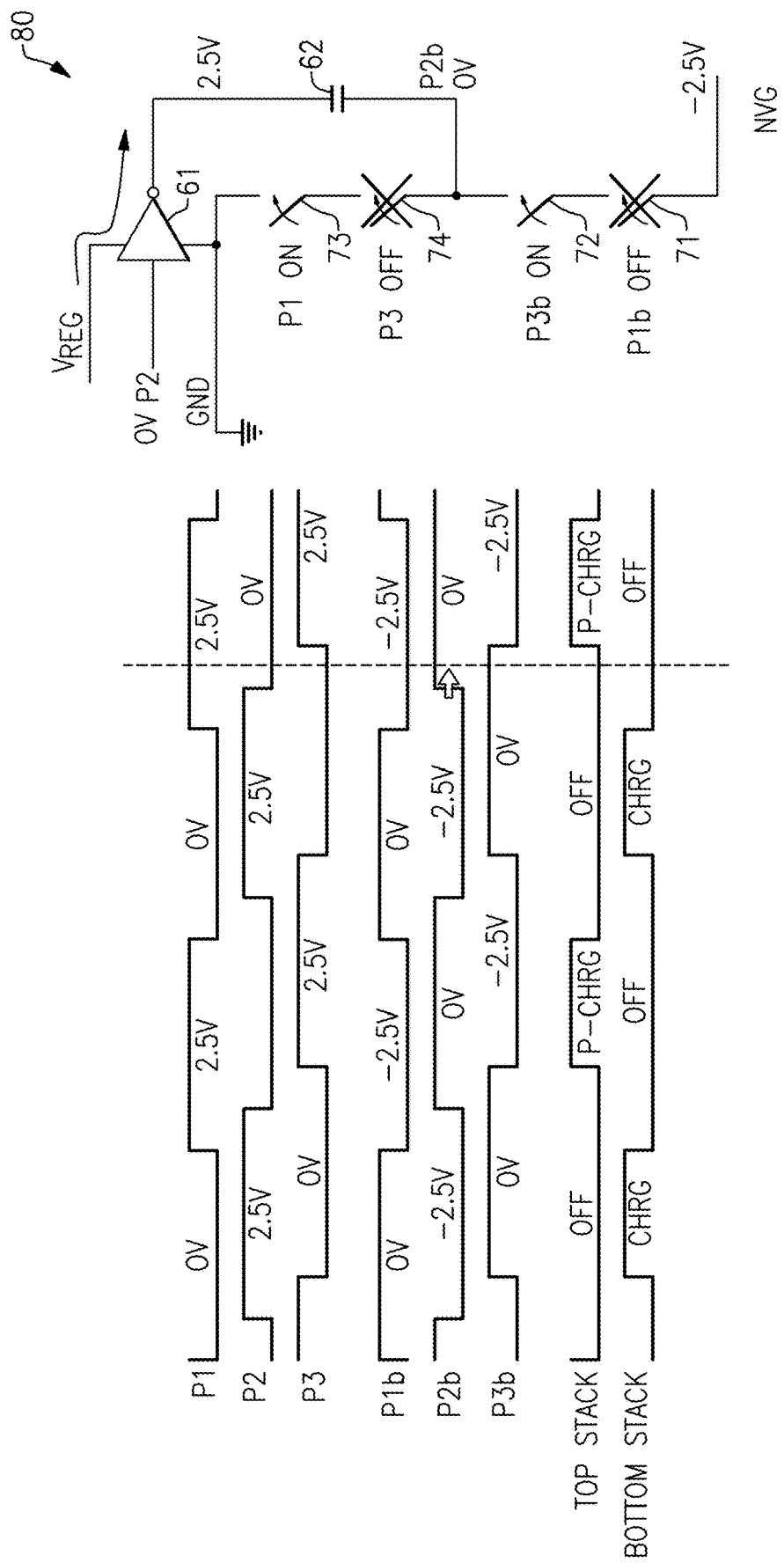
FIG. 6F is a sixth schematic diagram illustrating operation of the charge pump stage of FIG. 5B.

FIG. 6F depicts a sixth phase of operation of the charge pump stage 80 in which the second clock signal phase P2 transitions from high (2.5 V, in this example) to low (0 V, in this example). The second end of the flying capacitor 62 is disconnected from ground in the sixth phase.

Figure 6G:
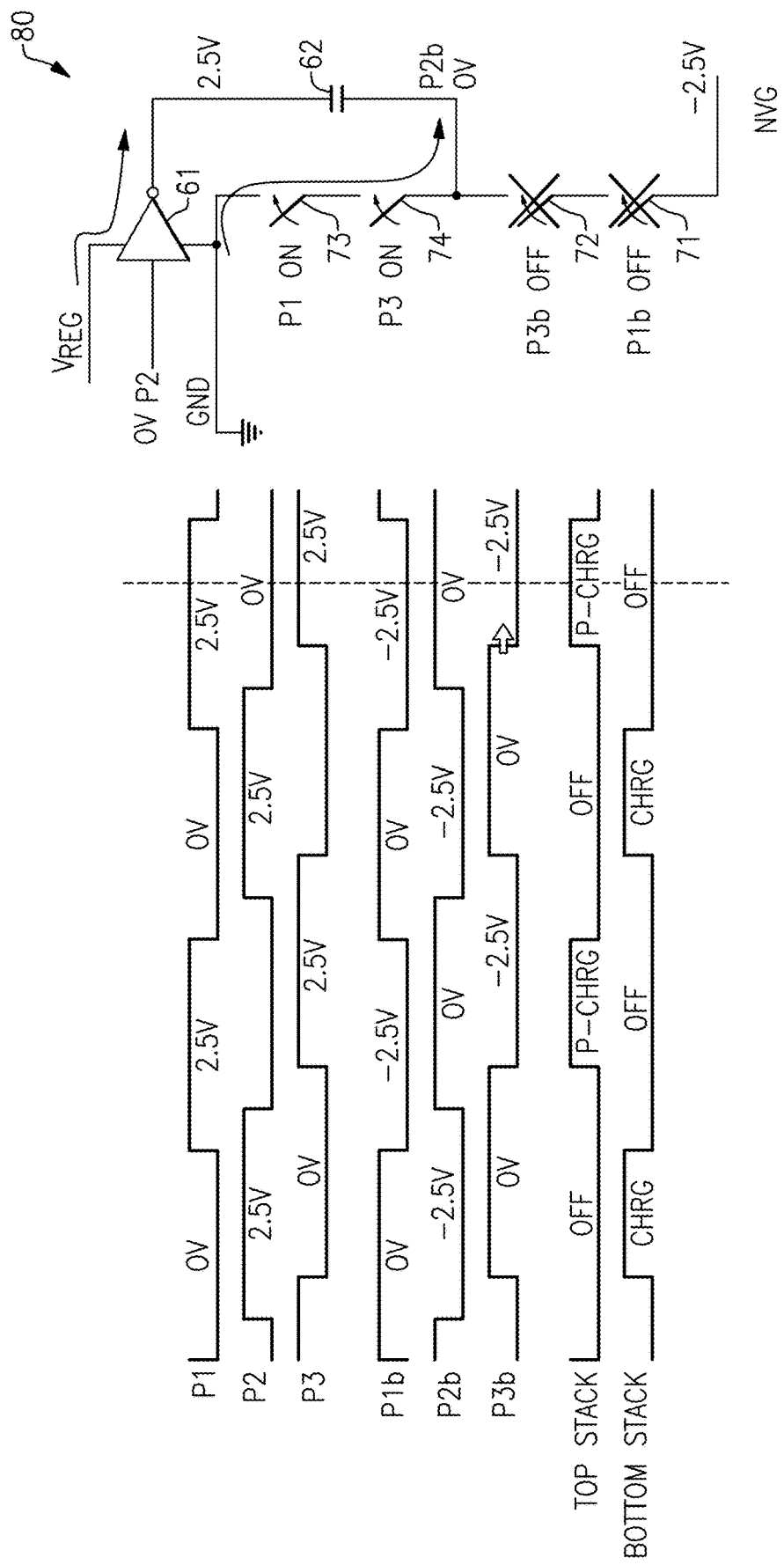
FIG. 6G is a seventh schematic diagram illustrating operation of the charge pump stage of FIG. 5B.

FIG. 6G depicts a return to the first phase of operation of the charge pump stage 80. The charge pump stage 80 is returned to the first phase by transitioning the second charging switch 74 from the off state to the on state and by transitioning the second discharging switch 72 from the on state to the off state.

Figure 7:
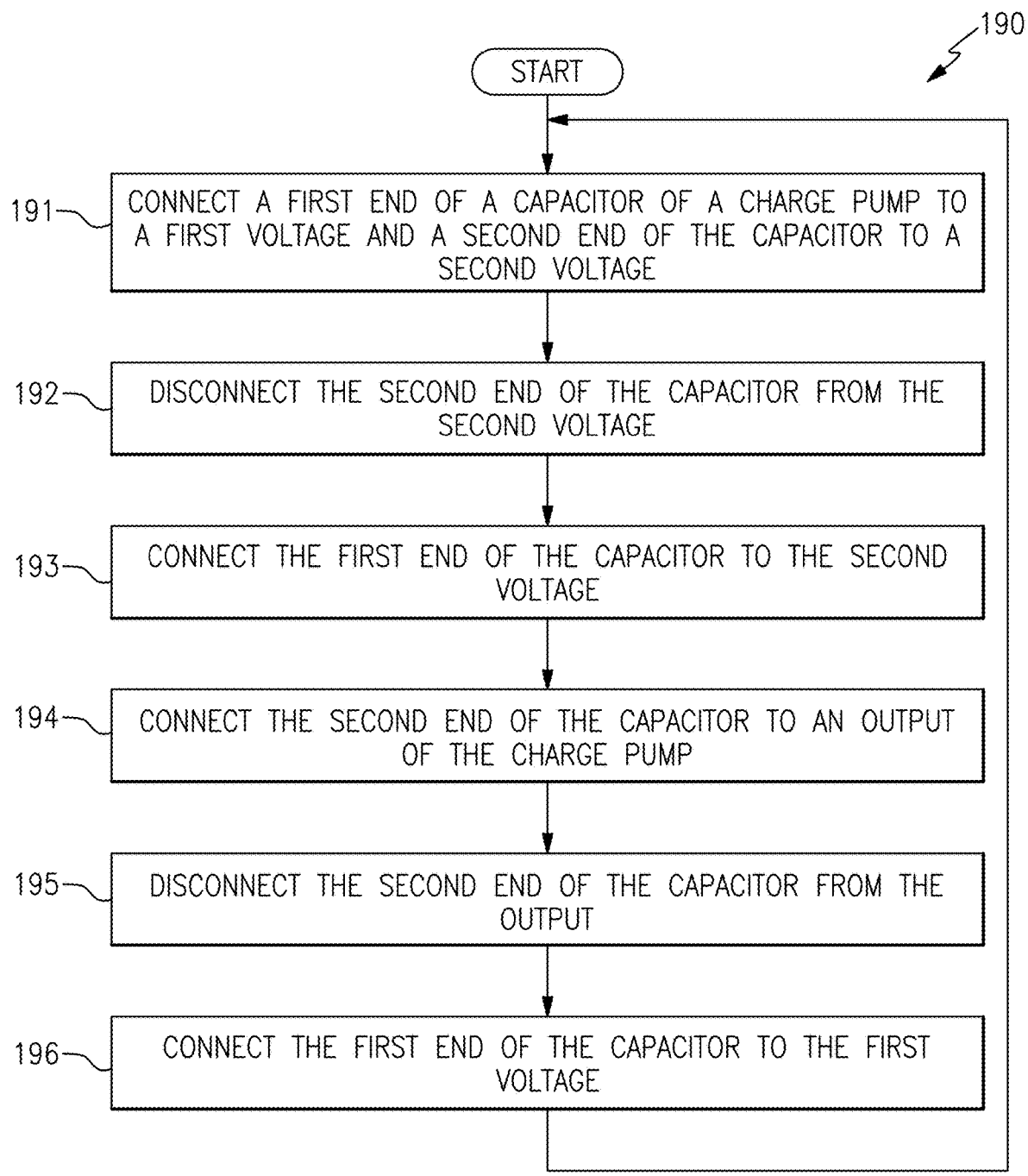
FIG. 7 is a flow chart of a method of generating a charge pump voltage according to one embodiment.

FIG. 7 is a flow chart of a method 190 of generating a charge pump voltage according to one embodiment. The method 190 can be performed by a charge pump including one or more charge pump stages implemented in accordance with the teachings herein.

The method 190 begins a step 191 in which a first end of a capacitor of a charge pump is connected to a first voltage (for instance, $V_{REG}$) and in which a second end of the capacitor is connected to a second voltage (for instance, ground). The method 190 continues to a step 192 in which the second end of the capacitor is disconnected from the second voltage.

With continuing reference to FIG. 7, the method 190 continues to a step 193 in which the first end of the capacitor is connected to the second voltage. Since the second end of the capacitor was disconnected from the second voltage in the step 192, the second end of the capacitor is electrically floating during the step 193 and thus swings in voltage in response to connecting the first end of the capacitor to the second voltage.

The method 190 continues to a step 194, in which the second end of the capacitor is connected to an output of the charge pump. By connecting the capacitor in this manner, the charge stored on the capacitor can be discharged to a load being driven by the charge pump.

With continuing reference to FIG. 7, the method 190 continues to a step 195 in which the second end of the capacitor is disconnected from the output. The method 190 continues to a step 196 in which the first end of the capacitor is connected to the first voltage. The method 190 returns to step 191 in which the second end of the capacitor is connected to the second voltage.

Figure 8:
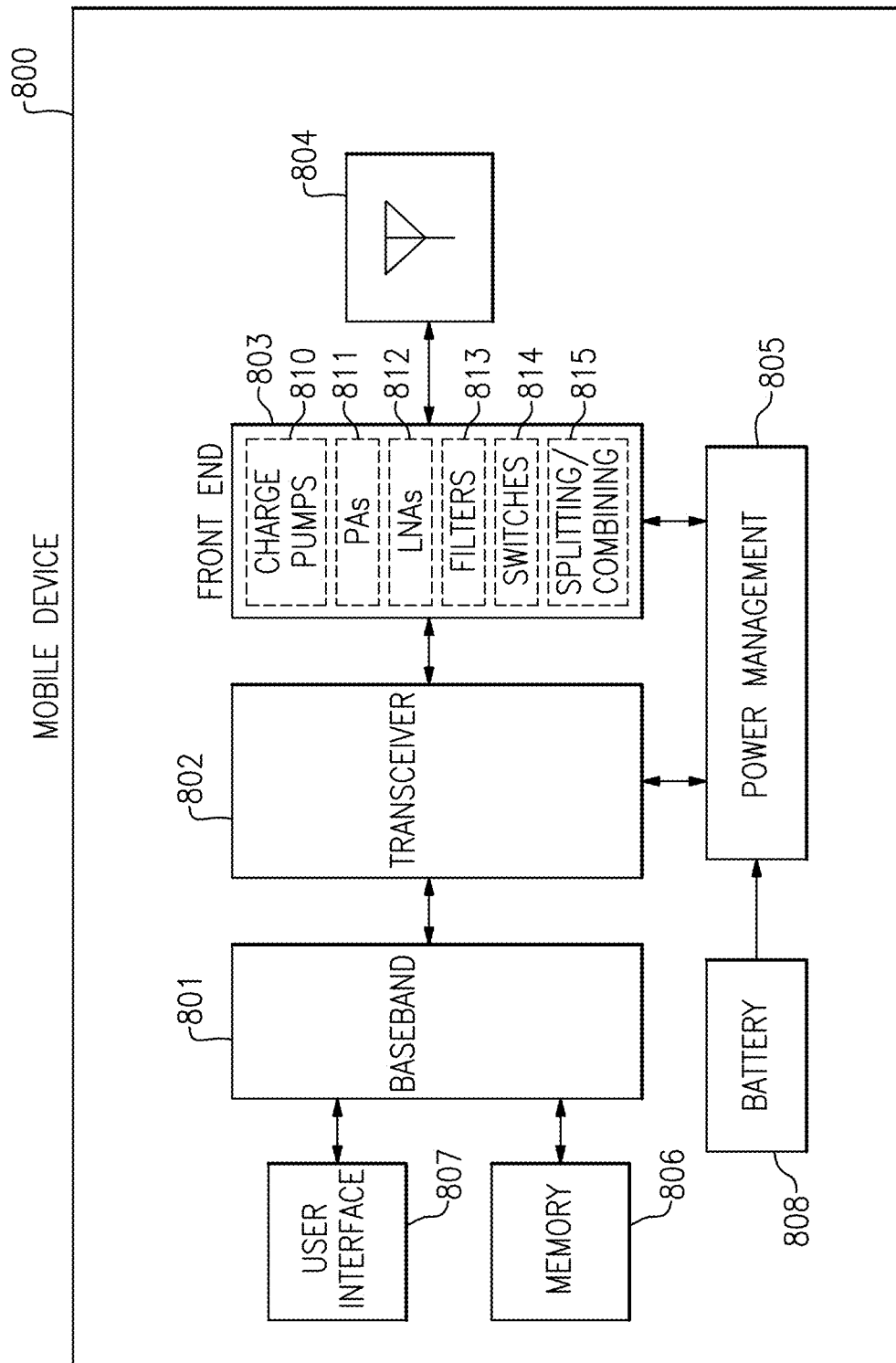
FIG. 8 is a schematic diagram of one embodiment of a mobile device.

FIG. 8 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 8 as the transceiver 802. In one example, separate components (for instance, separate circuits or dies) can be provided for handling certain types of RF signals.

The front end system 803 aids in conditioning signals transmitted to and/or received from the antennas 804. In the illustrated embodiment, the front end system 803 includes charge pumps 810, power amplifiers (PAs) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (110), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 8, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 8, the power management system 805 receives a battery voltage from the battery 808. The battery 808 can be any suitable battery for use in the mobile device 800, including, for example, a lithium-ion battery.

Figure 9:
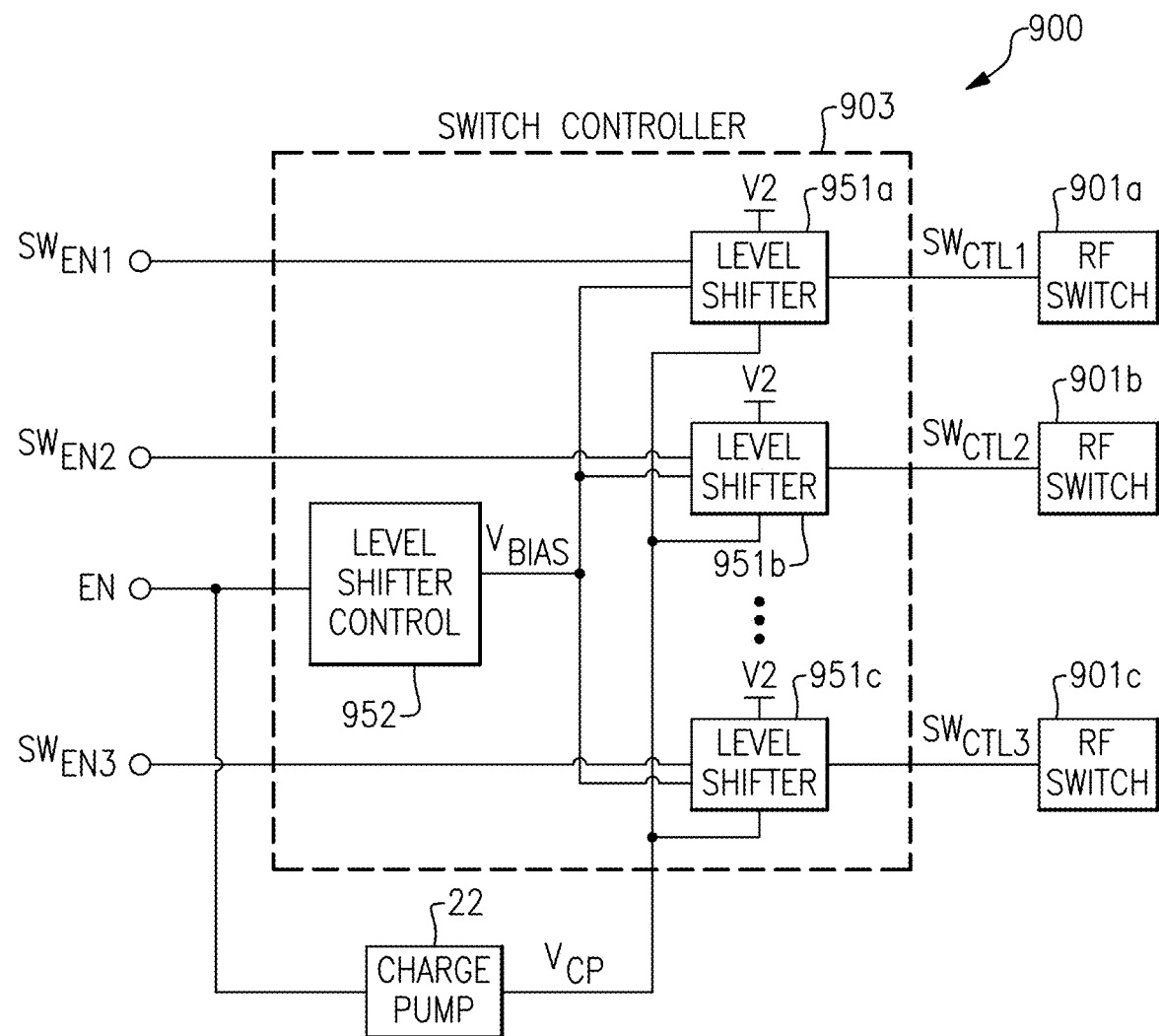
FIG. 9 is a schematic diagram of a front end system according to one embodiment.

FIG. 9 is a schematic diagram of a front end system 900 according to one embodiment. The front end system 900 includes a charge pump 22, a first RF switch 901a, a second RF switch 901b, a third RF switch 901c, and a switch controller 903. Although the front end system 900 is illustrated as including three RF switches, the front end system 900 can be adapted to include more or fewer RF switches.

The charge pump 22 receives a system enable signal EN and generates a charge pump voltage $V_{CP}$ when enabled. The charge pump 22 is enabled in a first state of the system enable signal EN and disabled in a second state of the system enable signal EN. For example, the first state can indicate a normal operating mode of the front end system 900 and the second state can indicate a standby mode of the front end system 900.

In the illustrated embodiment, the switch controller 903 receives the system enable signal EN, a first switch enable signal $SW_{EN1}$, a second switch enable signal $SW_{EN2}$, and a third switch enable signal $SW_{EN3}$. Additionally, the switch controller 903 generates a first switch control signal $S_{CTL1}$ for controlling the first RF switch 901a, a second switch control signal $SW_{CTL2}$ for controlling the second RF switch 901b, and a third switch control signal $SW_{CTL3}$ for controlling the third RF switch 901c.

As shown in FIG. 9, the switch controller 903 includes a first level shifter 951a, a second level shifter 951b, a third level shifter 951c, and a level shifter control circuit 952 that generates a bias voltage $V_{BIAS}$ for the levels shifters 951a-951c. The level shifters 951a-951c are powered by a power high supply voltage $V_2$ and the charge pump voltage $V_{CP}$. Although the illustrated switch controller includes three level shifters, the switch controller can include more or fewer level shifters.

The level shifters 951a-951c control the voltage levels of the first switch control signal $SW_{CTL1}$, the second switch control signal $SW_{CTL2}$, and the third switch control signal $SW_{CTL3}$ based on the state of the first switch enable signal $SW_{EN1}$, the second switch enable signal $SW_{EN2}$, and the third switch enable signal $SW_{EN3}$, respectively. For example, the first level shifter 951a can control the first switch control signal $SW_{CTL1}$ with the power high supply voltage $V_2$ in a first state of the first switch enable signal $SW_{EN1}$ and with the charge pump voltage $V_{CP}$ in a second state of the first switch enable signal $SW_{EN1}$.

Additional details of the front end system 900 can be as described earlier.

Figure 10A:
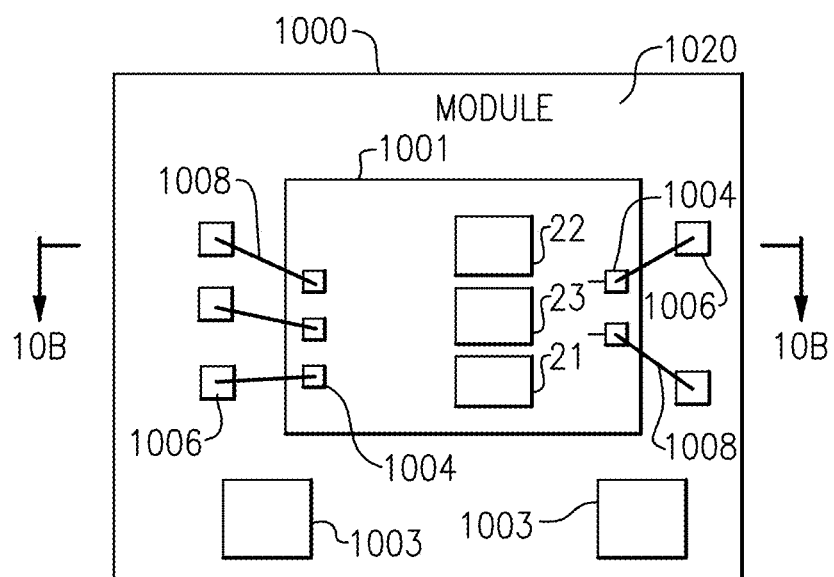
FIG. 10A is a schematic diagram of one embodiment of a packaged module.
Figure 10B:
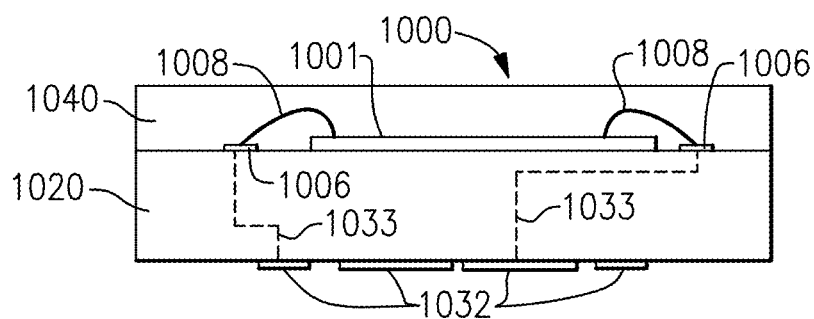
FIG. 10B is a schematic diagram of a cross-section of the packaged module of FIG. 10A taken along the lines 10B-10B.

FIG. 10A is a schematic diagram of one embodiment of a packaged module 1000. FIG. 10B is a schematic diagram of a cross-section of the packaged module 1000 of FIG. 10A taken along the lines 10B-10B.

The packaged module 1000 includes an IC or semiconductor die 1001, surface mount components 1003, wirebonds 1008, a package substrate 1020, and encapsulation structure 1040. The package substrate 1020 includes pads 1006 formed from conductors disposed therein. Additionally, the die 1001 includes pads 1004, and the wirebonds 1008 have been used to electrically connect the pads 1004 of the die 1001 to the pads 1006 of the package substrate 1001.

As illustrated in FIGS. 10A and 10B, the die 1001 includes RF switches 21, a charge pump 22, and a switch controller 23, which can be as described earlier. The charge pump 22 can be implemented in accordance with any of the embodiments herein.

The packaging substrate 1020 can be configured to receive a plurality of components such as the die 1001 and the surface mount components 1003, which can include, for example, surface mount capacitors and/or inductors.

As shown in FIG. 10B, the packaged module 1000 is shown to include a plurality of contact pads 1032 disposed on the side of the packaged module 1000 opposite the side used to mount the die 1001. Configuring the packaged module 1000 in this manner can aid in connecting the packaged module 1000 to a circuit board such as a phone board of a wireless device. The example contact pads 1032 can be configured to provide RF signals, bias signals, power low voltage(s) and/or power high voltage(s) to the die 1001 and/or the surface mount components 1003. As shown in FIG. 10B, the electrically connections between the contact pads 1032 and the die 1001 can be facilitated by connections 1033 through the package substrate 1020. The connections 1033 can represent electrical paths formed through the package substrate 1020, such as connections associated with vias and conductors of a multilayer laminated package substrate.

In some embodiments, the packaged module 1000 can also include one or more packaging structures to, for example, provide protection and/or facilitate handling of the packaged module 1000. Such a packaging structure can include overmold or encapsulation structure 1040 formed over the packaging substrate 1020 and the components and die(s) disposed thereon.

It will be understood that although the packaged module 1000 is described in the context of electrical connections based on wirebonds, one or more features of the present disclosure can also be implemented in other packaging configurations, including, for example, flip-chip configurations.

Applications

Some of the embodiments described above have provided examples in connection with wireless devices or mobile phones. However, the principles and advantages of the embodiments can be used for any other systems or apparatus that have needs for charge pumps with low noise.

Such charge pumps can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A front end system comprising:
a radio frequency switch;
a switch controller configured to bias the radio frequency switch with a charge pump voltage in a first state of a switch enable signal; and
a charge pump configured to generate the charge pump voltage at a charge pump output terminal, the charge pump including a switched capacitor, an inverter having an output electrically connected to a first end of the switched capacitor, a pair of discharging switches connected in series between a second end of the switched capacitor and the charge pump output terminal, and a pair of charging switches connected in series between the second end of the switched capacitor and a reference voltage, one charging switch of the pair of charging switches open and the other charging switch of the pair of charging switches closed during a transition from a charging operation to a discharging operation.

2. The front end system of claim 1 wherein one discharging switch of the pair of discharging switches is open and the other discharging switch of the pair of discharging switches is closed during the transition.

3. The front end system of claim 1 wherein the pair of charging switches is closed during the charging operation and open during the discharging operation.

4. The front end system of claim 1 wherein the pair of discharging switches is closed during the discharging operation and open during the charging operation.

5. The front end system of claim 1 wherein the charge pump is powered by a power high supply voltage and the reference voltage, the charge pump voltage less than the reference voltage.

6. The front end system of claim 1 wherein a first charging switch of the pair of charging switches is controlled by a first clock signal phase, an input of the inverter receives a second clock signal phase delayed relative to the first clock signal phase, and a second charging switch of the pair of charging switches is controlled by a third clock signal phase delayed relative to the second clock signal phase.

7. The front end system of claim 6 wherein a first discharging switch of the pair of discharging switches is controlled by an inverted version of the first clock signal phase and a second discharging switch of the pair of discharging switches is controlled by an inverted version of the third clock signal phase.

8. The front end system of claim 1 wherein the charge pump further includes an oscillator configured to generate a first plurality of clock signal phases, and combinatorial logic configured to process the first plurality of clock signal phases to generate a second plurality of clock signal phases, at least a portion of the pair of discharging switches controlled by the second plurality of clock signal phases.

9. The front end system of claim 1 wherein the charge pump includes a plurality of stages including a first stage and a second stage, the first stage including the switched capacitor, the inverter, the pair of charging switches, and the pair of discharging switches.

10. The front end system of claim 9 wherein a first discharging switch of the pair of discharging switches is controlled by a clock signal phase from the second stage.

11. A charge pump comprising:
a charge pump output terminal configured to provide a charge pump voltage;
a switched capacitor;
an inverter having an output electrically connected to a first end of the switched capacitor,
a pair of discharging switches connected in series between a second end of the switched capacitor and the charge pump output terminal; and
a pair of charging switches connected in series between the second end of the switched capacitor and a reference voltage, one charging switch of the pair of charging switches open and the other charging switch of the pair of charging switches closed during a transition from a charging operation to a discharging operation.

12. The charge pump of claim 11 wherein one discharging switch of the pair of discharging switches is open and the other discharging switch of the pair of discharging switches is closed during the transition.

13. The charge pump of claim 11 wherein the pair of charging switches is closed during the charging operation and open during the discharging operation.

14. The charge pump of claim 11 wherein the pair of discharging switches is closed during the discharging operation and open during the charging operation.

15. The charge pump of claim 11 wherein a first charging switch of the pair of charging switches is controlled by a first clock signal phase, an input of the inverter receives a second clock signal phase delayed relative to the first clock signal phase, and a second charging switch of the pair of charging switches is controlled by a third clock signal phase delayed relative to the second clock signal phase.

16. The charge pump of claim 15 wherein a first discharging switch of the pair of discharging switches is controlled by an inverted version of the first clock signal phase and a second discharging switch of the pair of discharging switches is controlled by an inverted version of the third clock signal phase.

17. The charge pump of claim 11 further comprising an oscillator configured to generate a first plurality of clock signal phases, and combinatorial logic configured to process the first plurality of clock signal phases to generate a second plurality of clock signal phases, at least a portion of the pair of discharging switches controlled by the second plurality of clock signal phases.

18. A packaged module comprising:
a package substrate; and
a semiconductor die attached to the package substrate, the semiconductor die including a radio frequency switch, a switch controller configured to bias the radio frequency switch with a charge pump voltage in a first state of a switch enable signal, and a charge pump configured to generate the charge pump voltage at a charge pump output terminal, the charge pump including a switched capacitor, an inverter having an output electrically connected to a first end of the switched capacitor, a pair of discharging switches connected in series between a second end of the switched capacitor and the charge pump output terminal, and a pair of charging switches connected in series between the second end of the switched capacitor and a reference voltage, one charging switch of the pair of charging switches open and the other charging switch of the pair of charging switches closed during a transition from a charging operation to a discharging operation.

19. The packaged module of claim 18 wherein a first charging switch of the pair of charging switches is controlled by a first clock signal phase, an input of the inverter receives a second clock signal phase delayed relative to the first clock signal phase, and a second charging switch of the pair of charging switches is controlled by a third clock signal phase delayed relative to the second clock signal phase.

20. The packaged module of claim 18 wherein a first discharging switch of the pair of discharging switches is controlled by an inverted version of the first clock signal phase and a second discharging switch of the pair of discharging switches is controlled by an inverted version of the third clock signal phase.

* * * * *